United States Patent [19]
Studebaker et al.

[11] Patent Number: 5,091,342
[45] Date of Patent: Feb. 25, 1992

[54] MULTILEVEL RESIST PLATED TRANSFER LAYER PROCESS FOR FINE LINE LITHOGRAPHY

[75] Inventors: Lawrence G. Studebaker, Fort Collins, Colo.; Edward H. Wong, Santa Rosa

[73] Assignee: Hewlett-Packard Company, Palo Alto, Calif.

[21] Appl. No.: 315,351

[22] Filed: Feb. 24, 1989

[51] Int. Cl.$^5$ .......................................... H01L 21/467
[52] U.S. Cl. ..................... 437/228; 437/203; 437/229; 437/944; 148/DIG. 100; 148/DIG. 105; 148/DIG. 143
[58] Field of Search ............... 437/228, 229, 944, 203; 148/DIG. 100, DIG. 105, DIG. 143

[56] References Cited

U.S. PATENT DOCUMENTS

| | | | |
|---|---|---|---|
| 4,266,333 | 5/1981 | Reichert | 437/229 |
| 4,376,664 | 3/1983 | Hataishi et al. | 437/229 |
| 4,532,002 | 7/1985 | White | 437/944 |

FOREIGN PATENT DOCUMENTS

| | | | |
|---|---|---|---|
| 59-141222 | 8/1984 | Japan | 148/DIG. 100 |

OTHER PUBLICATIONS

B. D. Cantos et al., "A Reliable Method for .25 Micron Gate MESFET Fabrication Using Optical Photolithography", *J. Electrochem. Soc.*, vol. 135, No. 5, pp. 1311-1312, May 1988.

L. G. Studebaker, G. J. DeWitte, F. L. Bugely, D. H. Riehl, "Prototype to Production Using the Hewlett-t-Packard Quarter-Micron Electron Beam System", J. Vac. Sci. Technol., B 5 (1), 92, 1987.

M. G. Rosenfield, J. J. Bucchignano, S. A. Rishton, D. P. Kern, L. M. Kettel, W. W. Molzen, F. J. Hohn, R. Viswanathan, J. M. Warlaumont, "Sub-Micron Electron-Beam Lithography Using a Beam Size Comparable to the Linewidth Tolerance", J. Vac. Sci. Technol., B 5(1), 114, 1987.

F. J. Hohn, A. D. Wilson, P. Coane, "Advanced Electron-Beam Lithography for 0.5 Micron to 0.25 Micron Device Fabrication", IBM J. Res. Develop., 32(4), 514, 1988.

R. M. Nagarajan, S. D. Rask, M. R. King, T. K. Yard, "Sub-Half Micrometer Gate Lift-Off by Three Layer Resist Process Via Electron Beam Lithography for Gallium Arsenide Monolithic Microwave Integrated Circuits (MIMICs)", SPIE Electron-Beam, X-Ray and Ion Beam Lithographies VII, vol. 923, 194, 1988.

H. Liu, M. P. deGrandrpe, W. E. Feely, "Characterization of High-Resolution Novolok Based Negative Electron-Beam Resist with 4u C/sq. cm Sensitivity", J. Vac Sci. Technol., B 6(1), 379, 1988.

L. Blum, M. E. Perkins, "A Study of the Effect of Key Processing Variables on the Lithographic Performance of Microposit SAL-601-ER7 Resist", J. Vac. Sci. Technol. B, 1988.

*Primary Examiner*—Brian E. Hearn
*Assistant Examiner*—Laura M. Holtzman
*Attorney, Agent, or Firm*—William C. Milks, III

[57] ABSTRACT

A multilevel resist process for fine line e-beam lithography, or, alternatively, deep ultraviolet (DUV) optical lithography with a clear field mask involving the use of a plated transfer layer for image reversal. The process preferably uses a high brightness, quarter-micron diameter electron beam and a high speed negative resist to fabricate microwave MESFETs, MODFETs, and integrated circuits with gate lengths of 0.25 micron and below. This is achieved by producing a line of negative resist which can be developed to 0.25 micron or below. A plated transfer layer is then applied which provides image reversal, converting the line of resist into an opening suitable for conventional gate recess etching, gate metal deposition, and lift-off. A positive resist can be substituted for the negative e-beam resist and exposed with DUV through a clear field mask instead of an electron beam for the fabrication of MESFETs.

17 Claims, 12 Drawing Sheets

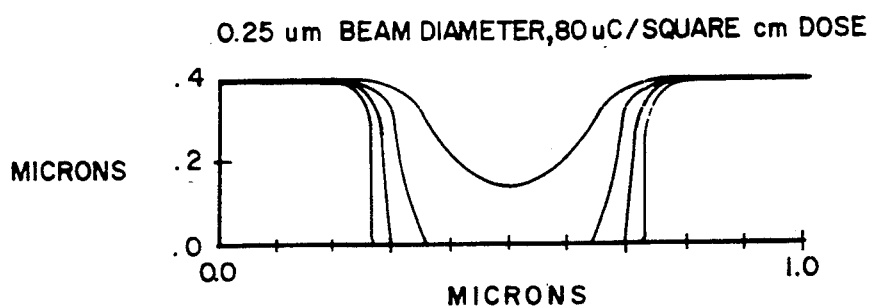
FIG._1A
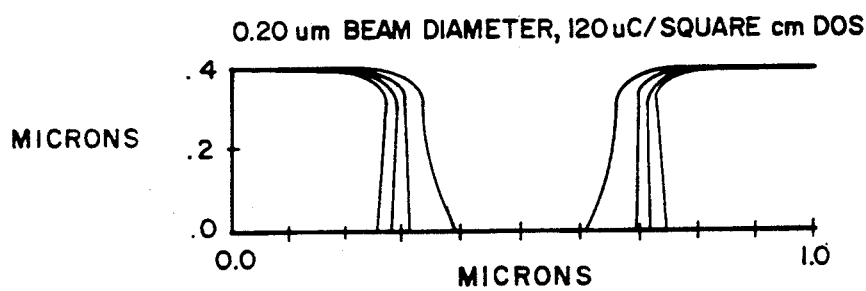
FIG._1B
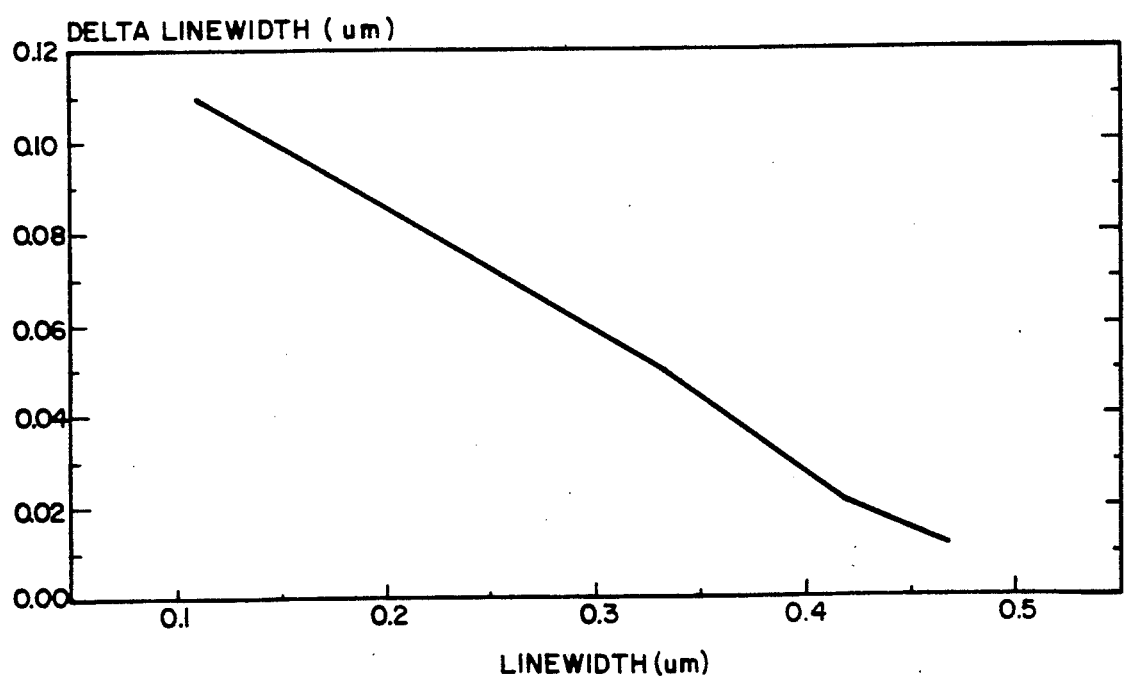
FIG._2

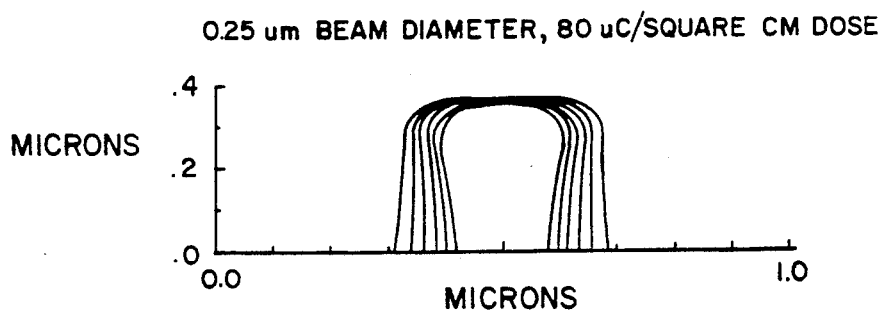
FIG._ 3A
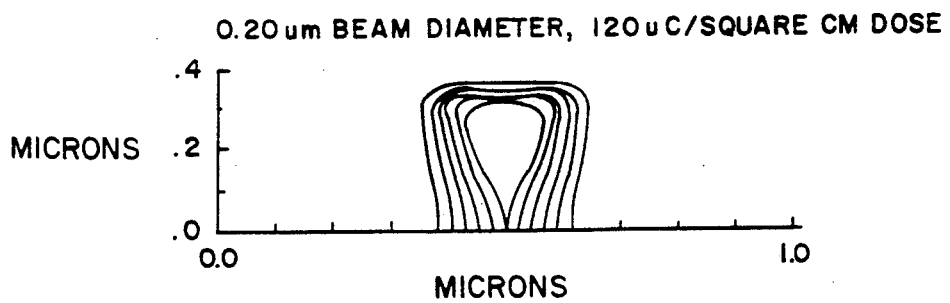
FIG._ 3B
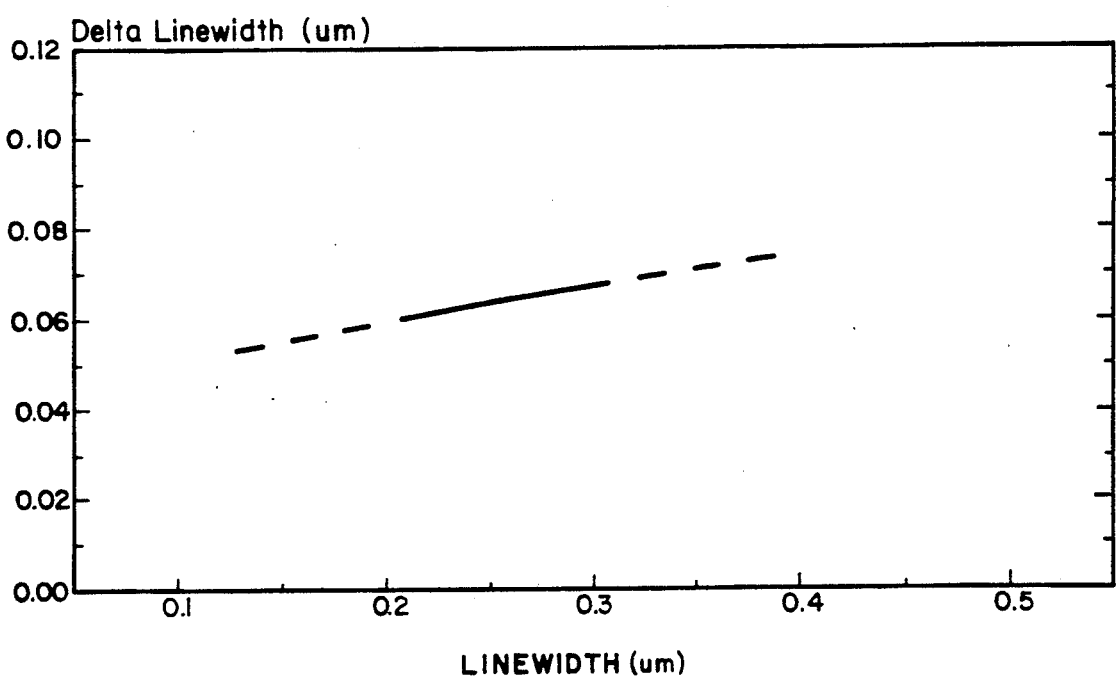
FIG._ 4

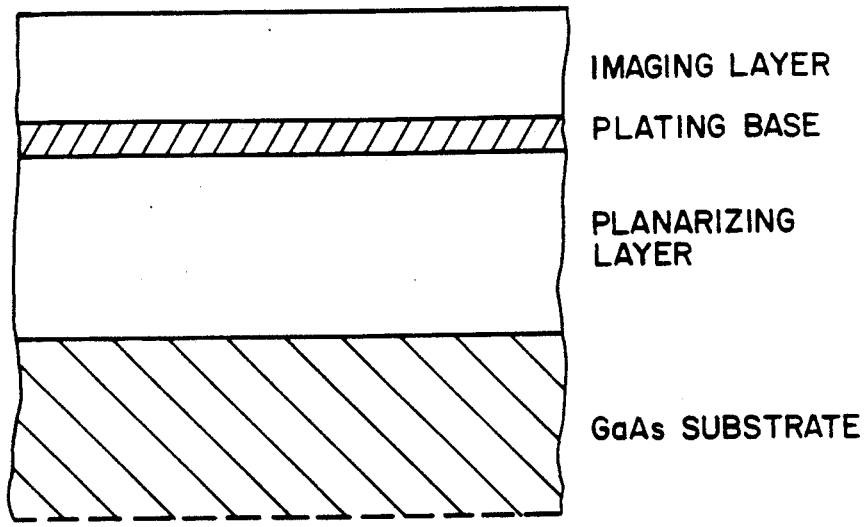
FIG.— 5A
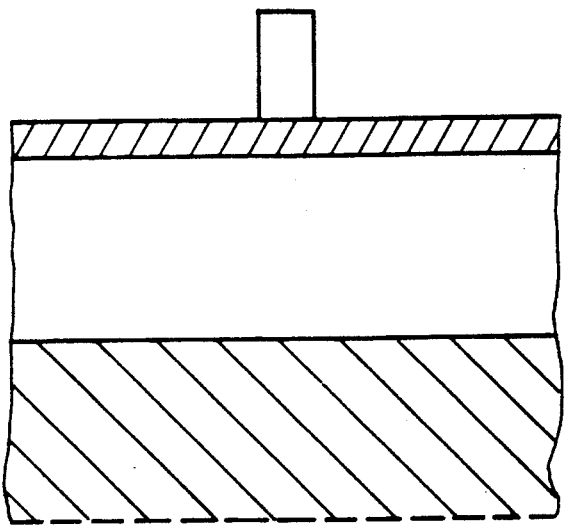
FIG.— 5B

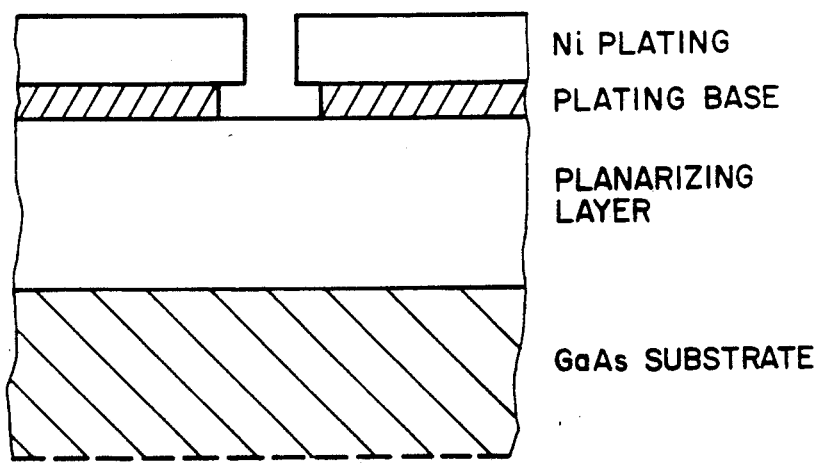
FIG._ 5C
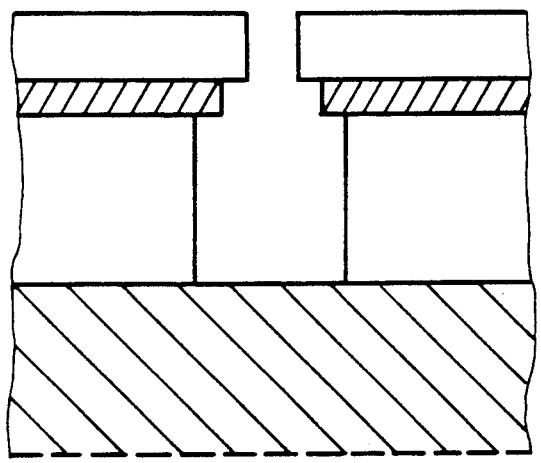
FIG._ 5D
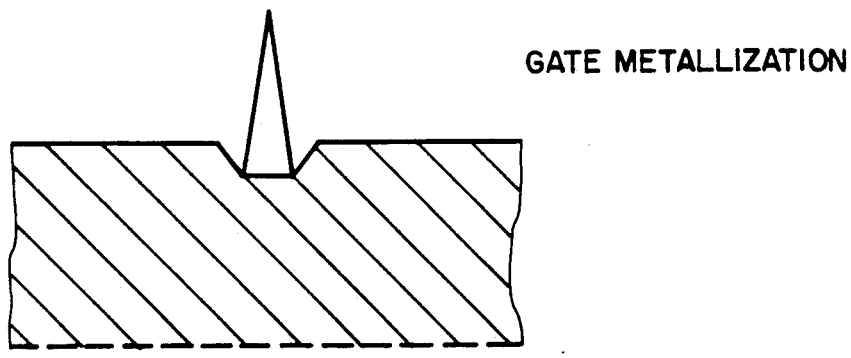
FIG._ 5E

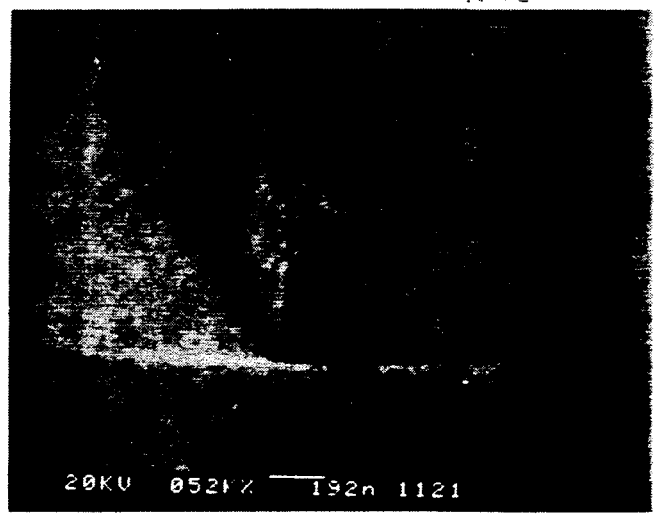
FIG._ 6

FIG._ 7A
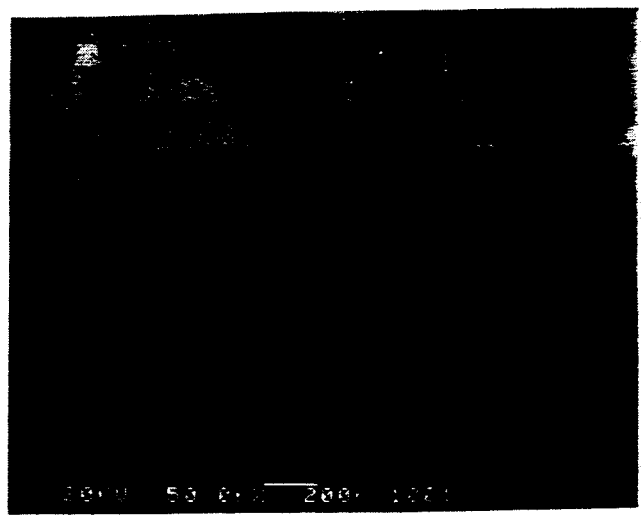
FIG._ 7B
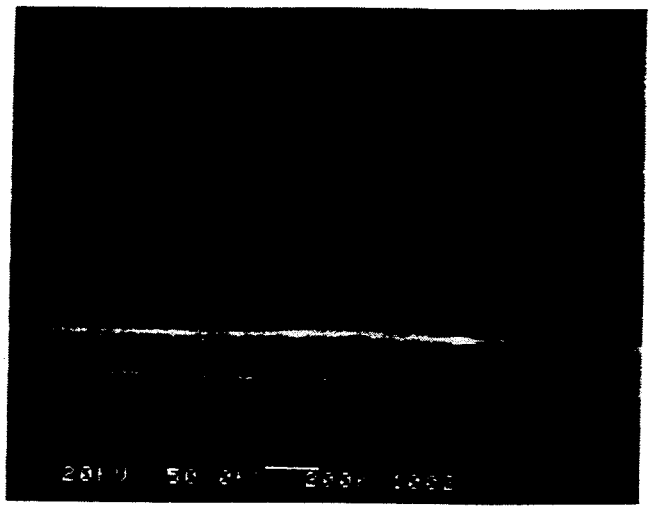
FIG._ 7C
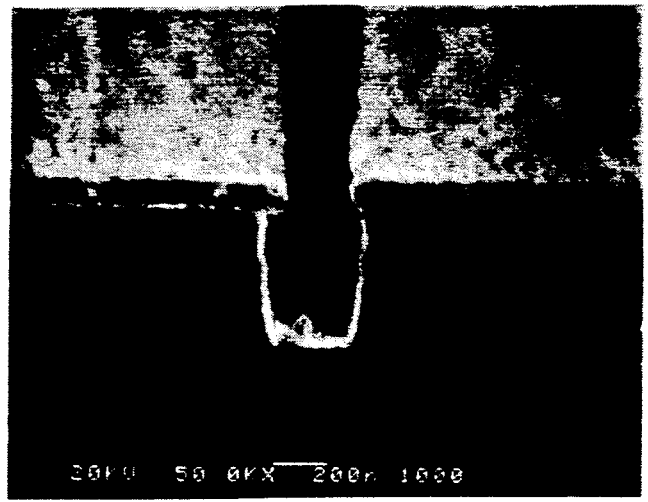

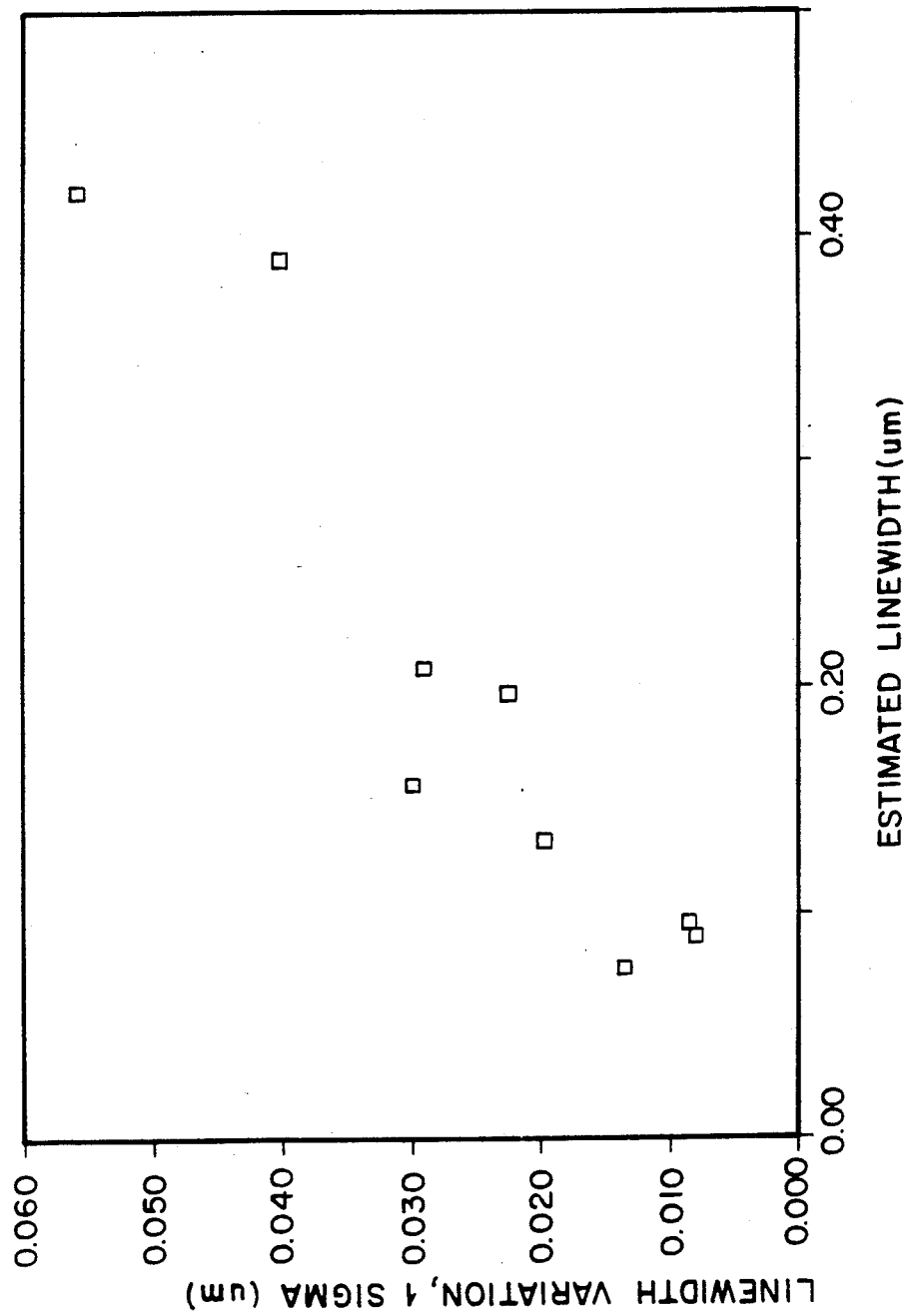
FIG._ 8

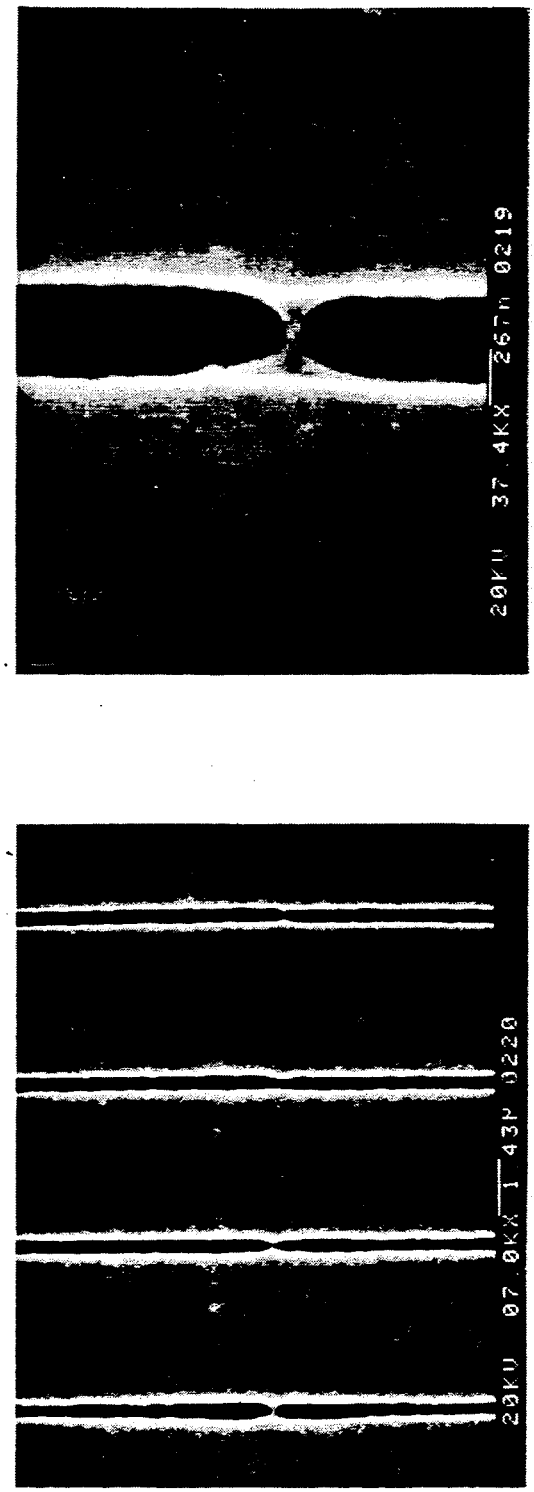
FIG._9A

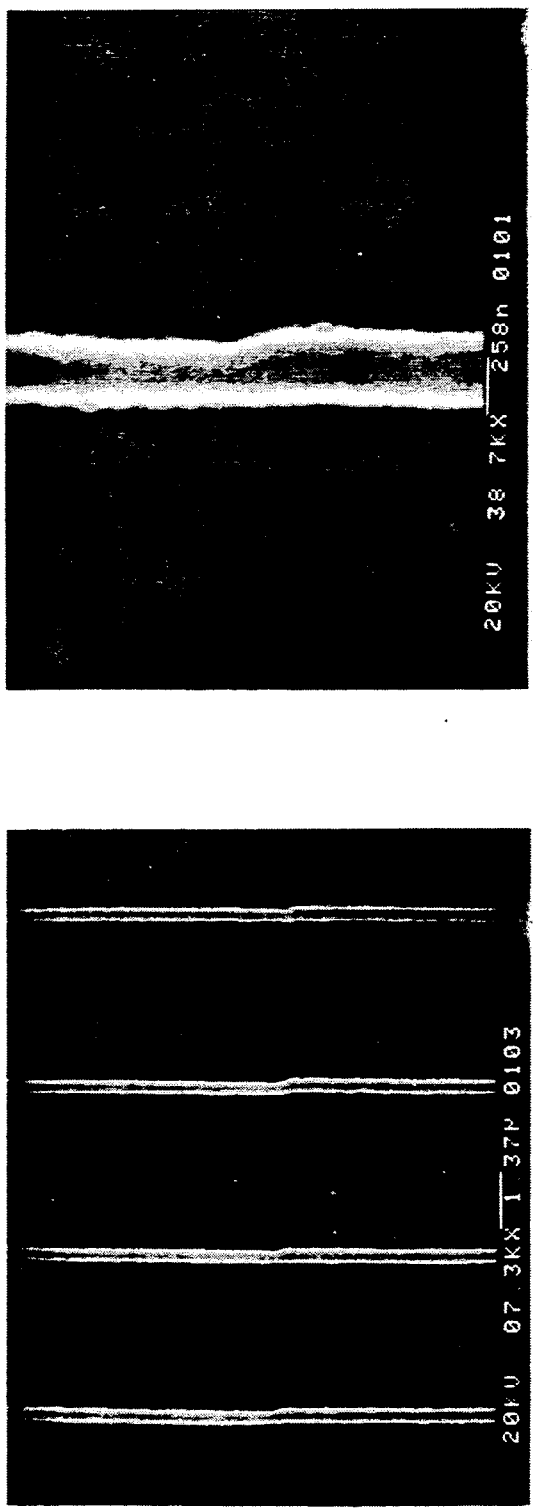
FIG._9B

FIG._10A
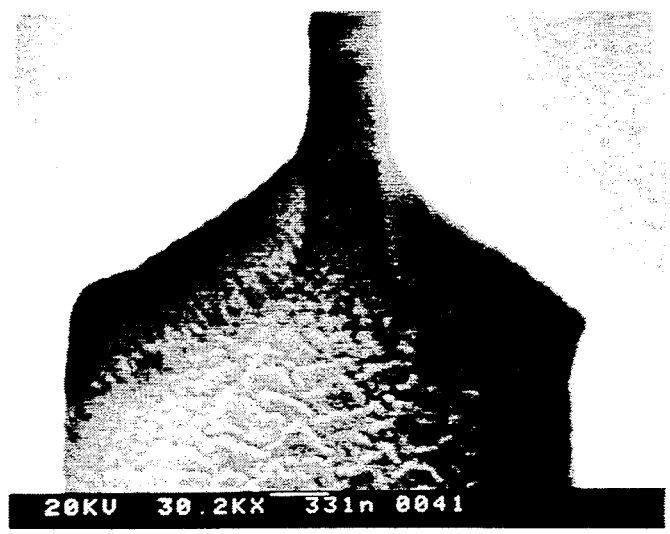
FIG._10B
FIG._10C

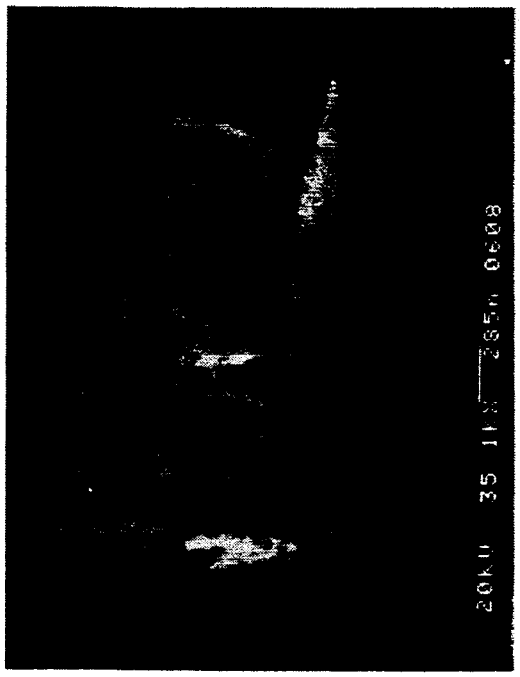
FIG._12
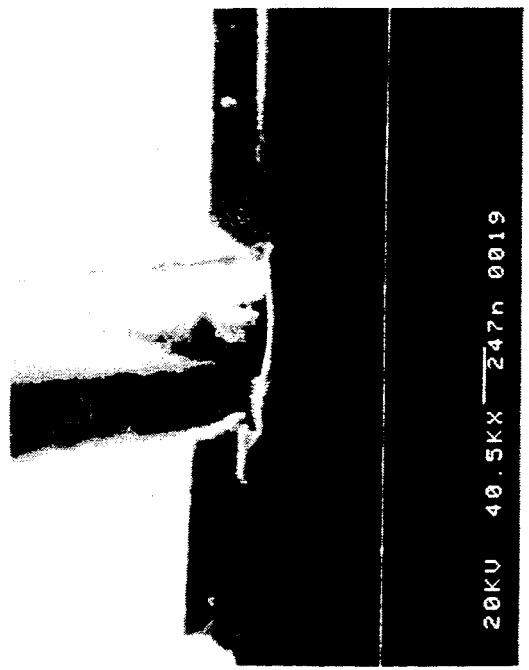
FIG._11

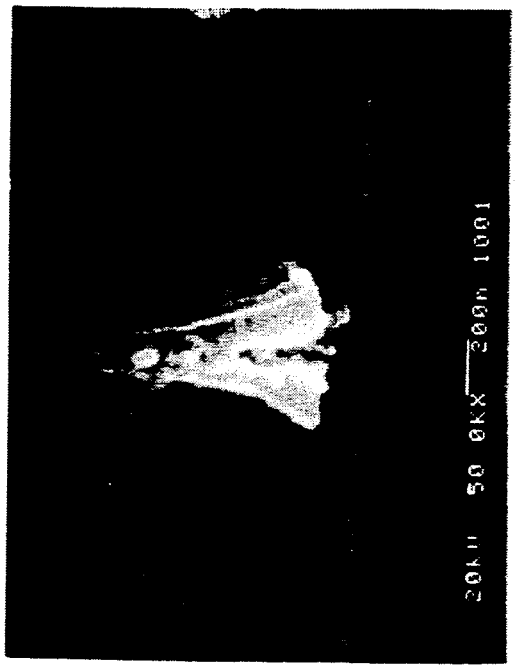
FIG._14
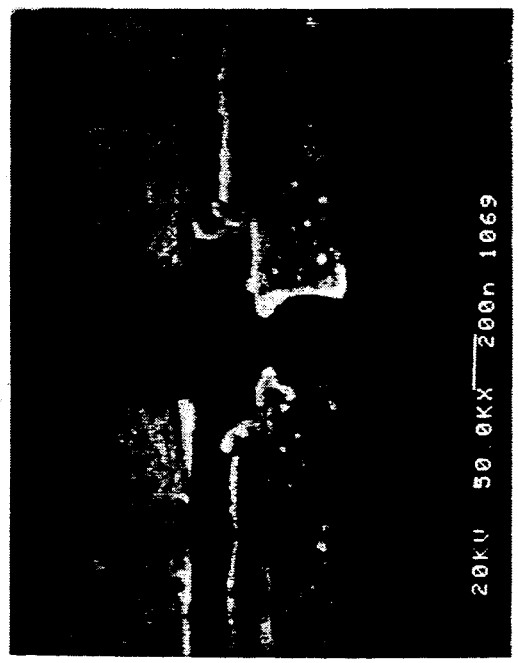
FIG._13

MULTILEVEL RESIST PLATED TRANSFER LAYER PROCESS FOR FINE LINE LITHOGRAPHY

BACKGROUND OF THE INVENTION

This invention relates to semiconductor processing and, more particularly, to processing semiconductor materials using lithography. Specifically, one embodiment of the invention is directed to a multilevel resist process involving the use of a plated transfer layer useful for fabricating semiconductor devices, such as gallium arsenide (GaAs) FET gate fabrication.

Generally, there are two types of lithographic techniques used for semiconductor processing, optical and electron-beam (e-beam). E-beam lithography is a valuable tool for fabrication of devices with geometries below the limits of optical lithography. However, the need for a small beam diameter and multiple scans to produce a minimum geometry with good linewidth control greatly reduces throughput. Poor sensitivity of available resists also reduces throughput.

By minimizing sources of beam size variation and e-beam system noise, it is possible to expose and develop a layer of positive resist (PMMA) to yield a 0.25 micron opening directly. See, L. G. Studebaker, G. J. DeWitte, F. L. Bugely, D. H. Riehl, "Prototype to Production Using the Hewlett-Packard Quarter-Micron Electron Beam System," *J. Vac. Sci. Technol.* B 5(1),92,1987. However, this requires a very uniform beam size over the exposure field.

For example, a 0.05 micron variation in a 0.25 micron beam diameter represents about a 50% exposure dose variation if the beam current is constant. FIG. 1 shows how much this beam size variation affects opening width control in a single layer of PMMA resist.

In FIG. 1A, development contours are modeled using the SAMPLE program available from the University of California at Berkeley for a beam diameter of 0.25 micron and a dose of 80 $\mu$C/sq. cm. The four contours are advancing with time to define an opening in the resist. Note that the contours are relatively far apart when the width of the opening is 0.25 micron, indicating that the process is difficult to control. Nonetheless, with suitable process control, a 0.25 micron opening is attainable.

However, with the addition of slight beam size variation, the process deteriorates. FIG. 1B shows the same four development contours for PMMA exposure with a 0.2 micron beam diameter. Since the beam area is smaller, and the beam current has not changed, the effective exposure dose has increased to about 120 $\mu$C/sq. cm. This causes the resist to develop faster, resulting in a larger opening.

As shown by a comparison of FIGS. 1A and 1B, when the regions exposed with a 0.2 micron beam are opened to a width of about 0.25 micron, the regions exposed with a 0.25 micron beam are not yet open. Also, when the regions exposed with a 0.25 micron beam are opened to a width of about 0.25 micron, the regions exposed with a 0.2 micron beam are opened to about 0.4 micron. If the beam diameter is varying from 0.2 to 0.25 micron over the exposure field, FIGS. 1A and 1B represent the variation in opening width that should be expected on a wafer for a particular development time contour. This difference in linewidth versus nominal linewidth is plotted in FIG. 2 and graphically illustrates the result of a beam size variation when writing an opening in PMMA.

FIG. 3 shows the same modeled development time contours for a line of PMMA. A line is produced by exposing the entire field except where the resist is to remain. Note that development contours are relatively close together when the resist linewidth is 0.25 micron, indicating that the process should be easier to control. More importantly, the difference in the linewidth due to the beam size variation from 0.2 to 0.25 micron is smaller for a line of PMMA resist than for an opening, which means that the process is less sensitive to beam size variations. This difference in linewidth versus the nominal linewidth is plotted in FIG. 4 and shows that the linewidth variation is constant or decreasing for decreasing linewidth of PMMA resist.

The results of FIGS. 1 through 4 can be summarized as follows. Achieving a 0.25 micron opening in positive resist with a 0.25 micron beam size requires under-exposure and/or under-development, which leads to a large linewidth variation for a dose variation. Achieving a 0.25 micron line of negative resist using a 0.25 micron beam size permits over-exposure and/or over-development, leading to a small linewidth variation for a dose variation. The major drawback of producing a line of PMMA resist using e-beam exposure is that essentially the entire exposure field must be written, except for a few fine lines. This is a tremendous reduction of wafer throughput for the exposure tool compared to exposing a few fine lines.

A number of researchers are working on methods of producing smaller lines with e-beam lithography, as well as optical lithography. However, progress in this field is slow.

SUMMARY OF THE INVENTION

One embodiment of the present invention provides a multilevel resist process for fine line e-beam lithography, or, alternatively, deep ultraviolet (DUV) optical lithography with a clear field mask. The process involves the use of a plated transfer layer.

The process in accordance with the invention preferably uses a high brightness, quarter-micron diameter electron beam and a high speed negative resist to fabricate microwave MESFETs, MODFETs, and integrated circuits with gate lengths of 0.25 micron and below. This is achieved by producing a line of negative resist which can be developed to 0.25 micron or below.

Quarter-micron GaAs FET gate lithography is achieved with high throughput using a 0.25 micron e-beam system and a high sensitivity negative e-beam resist. Unlike an opening in positive resist, the linewidth variation for a line of negative resist decreases as the linewidth is reduced by increased development. A plated transfer layer is then applied which provides image reversal, converting the line of resist into an opening suitable for conventional gate recess etching, gate metal deposition, and lift-off.

The process starts with a planarizing layer of PMGI, PMMA, or novolac resist applied to a substrate of semiconductor material, such as GaAs. A plating base of gold/titanium is then evaporated onto the planarizing layer, and a negative e-beam resist, preferably Shipley SAL-601-ER7, is coated and baked on top of the plating base. The SAL-601-ER7 resist is then exposed at 10 to 20 $\mu$C/sq. cm, post-exposure baked, and developed to produce a fine line of resist on top of the plating base. The titanium is then etched, preferably dry-etched, and nickel is selectively plated where the gold plating base is exposed. The SAL-601-ER7 resist is then removed in an oxygen plasma, and the plating base is etched, preferably wet-etched, out of the opening to expose the planarizing layer. The planarizing layer can then be dry-etched or exposed and developed using the nickel layer as a mask.

In addition to high throughput and good linewidth control, the process in accordance with this embodiment of the invention has other advantages. The plating base is thin enough for the electron beam to easily penetrate to the substrate, providing a good backscattering signal for layer-to-layer alignment. The plating base acts as a charging-elimination layer when working with a semi-insulating substrate, such as GaAs, and eliminates the need for evaporation of a separate layer. The plated nickel exhibits low residual stress and very low etch rates in chlorinated and fluorinated plasmas, so linewidth control is maintained throughout gate processing. Also, the ability to use different planarizing layers allows the process to be tailored to a specific semiconductor processing application.

The process in accordance with this embodiment of the invention has been used to fabricate discrete microwave MODFETs with 280 mW/mm output power and 6 dB gain at 40 GHz. The process has also been used to fabricate microwave integrated circuits with typical MESFET performance of 420 mW/mm output power and 6 dB gain at 18 GHz.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings. In the drawings:

FIG. 1 shows modeled development contours for an e-beam exposure leaving an opening in PMMA based on a 0.25 micron beam diameter, 80 $\mu$C/sq. cm dose (FIG. 1A) and a 0.2 micron beam diameter, 120 $\mu$C/sq. cm dose (FIG. 1B);

FIG. 2 illustrates delta linewidth versus linewidth from the contours shown in FIG. 1, where delta linewidth equals maximum minus minimum linewidth from the model;

FIG. 3 shows modeled development contours for an e-beam exposure leaving a line in PMMA based on a 0.25 micron beam diameter, 80 $\mu$C/sq. cm dose (FIG. 3A) and a 0.2 micron beam diameter, 120 $\mu$C/sq. cm dose (FIG. 3B);

FIG. 4 illustrates delta linewidth versus linewidth from the contours shown in FIG. 3, where delta linewidth equals maximum minus minimum linewidth from the model;

FIG. 5 shows plated transfer layer components after trilayer preparation (FIG. 5A), after SAL-601-ER7 processing (FIG. 5B), after plating a plating base (FIG. 5C), after plated transfer layer processing (FIG. 5D), and after lift-off (FIG. 5E);

FIG. 6 shows a SAL-601-ER7 resist line on the plating base;

FIG. 7 shows final lift-off cross-sections, including a PMGI planarizing layer (FIG. 7A), PMMA planarizing layer (FIG. 7B), and AZ 1350 B planarizing layer (FIG. 7C);

FIG. 8 illustrates linewidth variation versus linewidth based upon resistor measurements, where linewidth variation equals 1 sigma value for 35 measurements;

FIG. 9 shows the effect of sub-field joining errors for a positive bilayer process (FIG. 9A) and the plated transfer layer process in accordance with the invention (FIG. 9B);

FIG. 10 shows a 0.4 micron integrated circuit gate process with a PMGI planarizing layer after $SiO_2$ reactive-ion etch (RIE) in $CF_4$ plus oxygen (FIG. 10A), after buffered HF dip (FIG. 10B), and after ion-milling (FIG. 10C);

FIG. 11 shows a MESFET gate with gate length (Lg) equal to 0.4 micron;

FIG. 12 shows a MODFET gate with Lg equal to 0.25 micron;

FIG. 13 shows a multilevel structure for a "T" gate; and

FIG. 14 shows a "T" gate with Lg equal to 0.25 micron.

DETAILED DESCRIPTION OF THE PREFERRED EMBODIMENTS

The key to a high-throughput quarter-micron e-beam direct-write process is the ability to fabricate a 0.25 micron geometry with a 0.25 micron electron beam. This permits the highest beam current and the highest writing speed to achieve a required exposure dose. However, any variation of the beam size as features, such as gates, are written leads to a dose variation and a resulting linewidth variation. See, for example, M. G. Rosenfield, J. J. Bucchignano, S. A. Rishton, D. P. Kern, L. M. Kettell, W. W. Molzen, F. J. Hohn, R. Viswanathan, J. M. Warlaumont, "Sub-Micron Electron-Beam Lithography Using a Beam Size Comparable to the Linewidth Tolerance," *J. Vac. Sci. Technol.* B 5(1),114,1987, and F. J. Hohn, A. D. Wilson, P. Coane, "Advanced Electron-Beam Lithography for 0.5 Micron to 0.25 Micron Device Fabrication," *IBM J. Res. Develop.* 32(4),514,1988.

Generally, exposing a line of negative e-beam resist provides the same advantages as producing a line of positive resist. That is, the sensitivity to beam size variations is minimized, and the linewidth variation decreases with linewidth.

By way of departure, however, the process in accordance with the invention uses a negative resist as the top layer of a multilayer resist system. This is desirable, since for a line of negative resist, the linewidth and the linewidth variation (due to the dose variation) both decrease with increased development. Quarter-micron GaAs FET gate lithography is thus attainable with high throughput using a 0.25 micron e-beam system and a high sensitivity negative e-beam resist. A plated transfer layer then provides image reversal, converting the resist line into an opening suitable for conventional gate recess etching, gate metal deposition, and lift-off.

Considered in more detail, achieving a 0.25 micron line of negative resist using a 0.25 micron beam size permits over-exposure and/or over-development, leading to a small linewidth variation for a dose variation. This is a good reason for using a line of negative resist to achieve linewidth control of the smallest device geometries, regardless of whether a line or an opening in resist is actually required for the process. A process is then needed to convert the line of negative resist into the required structure. For GaAs FET gate lithography, where a lift-off structure is commonly employed, the process in accordance with the invention converts a line of negative resist into a lift-off structure using an image reversing plated transfer layer.

A typical transfer layer process comprises the steps of (starting at the substrate) a planarizing layer, a transfer layer, and an imaging layer. The imaging layer is used to define the desired pattern in the transfer layer. The transfer layer is then used to transfer the desired pattern into the planarizing layer by wet or dry processing.

Generally, the process in accordance with the invention begins with a trilayer, as shown in FIG. 5A. The trilayer comprises a bottom "planarizing layer" applied to a semiconductor substrate. The planarizing layer preferably consists of PMMA, Shipley PMGI, or a novolac resist.

The trilayer also comprises a "plating base." The plating base preferably consists of gold/titanium evaporated on top of the planarizing layer.

Finally, the trilayer comprises an, "imaging layer" coated on top of the plating base. The imaging layer preferably consists of Shipley SAL-601-ER7 negative e-beam resist. Its sensitivity, 5–10 $\mu$C/sq. cm, provides high throughput. Its ability to produce straight sidewalls with excellent linewidth control and repeatability greatly contributes to process control.

To form a structure in this trilayer suitable for lift-off, the negative e-beam resist is exposed, post-exposure baked, and developed in accordance with the recommendations of the manufacturer to yield a fine line of resist on top of the plating base, as shown by the cross-section in FIG. 5B. About 1000 angstroms of nickel are then selectively electroplated where the plating base is exposed, the negative resist is removed in an oxygen plasma, and the plating base is etched out of the opening to expose the planarizing layer, as shown in FIG. 5C.

The planarizing layer can then be dry-etched or flood-exposed and developed using the nickel layer as a mask. This yields the structure shown by the cross-section in FIG. 5D. The gate recess, metal deposition, and lift-off can now be performed to yield a final gate cross-section, as shown in FIG. 5E.

Linewidth control of $+/-0.060$ micron (2 sigma) is achieved for 0.25 micron lines, based upon electrical measurements of 315 resistors on nine wafers. Yield for these test resistors approaches 100%.

Considered in further detail, transfer layer processes have several advantages for device fabrication. By using a thin imaging layer to define a transfer layer, resolution can be enhanced. If the transfer layer is then used as a mask to develop or etch a thick planarizing layer, contrast is enhanced. Also, many e-beam resists are fragile and flow or decompose during the heat and radiation flux encountered in typical evaporation and plasma processes. This can have the effect of total failure of the resist structure during processing or more subtle effects such as organic contamination or a resistivity change in a deposited film. By using a transfer layer, the imaging resist can be chosen for its speed and resolution. The transfer layer and the planarizing layer under it can be chosen for compatibility with the required processing.

A transfer layer can be formed by etching a deposited film through openings in the imaging layer. See, R. M. Nagarajan, S. D. Rask, M. R. King, T. K. Yard, "Sub-Half Micrometer Gate Lift-Off by Three Layer Resist Process Via Electron Beam Lithography for Gallium Arsenide Monolithic Microwave Integrated Circuits (MIMICs)," SPIE Electron-Beam, X-Ray and Ion Beam Lithographies VII, Vol. 923,194,1988. This provides enhanced resolution, contrast, and durability. However, it does not provide the desired image reversal.

A transfer layer formed by evaporating and lifting a layer of metal uses a line of resist to produce an opening in the transfer layer, so it incorporates the desired image reversal. See, B. D. Cantos, R. D. Remba, "An Improved Technique for ¼ Micrometer Gate Length GaAs MESFET Fabrication by Optical Lithography," SPIE Advances in Resist Technology and Processing IV, Vol. 771,346,1987. This technique also has the advantage of permitting a thick, even opaque, transfer layer, since the transfer layer is deposited after resist alignment and exposure.

Unfortunately, producing a lift-off cross-section in a quarter-micron line of resist can be difficult. Also, lifting the imaged resist in a solvent after transfer layer deposition places restrictions upon selection of the resist and the planarizing layer.

Preferably, the process in accordance with the invention uses a plated transfer layer. This has the same advantages as the evaporated and lifted transfer layer, but removes the lift-off requirement for the imaging resist. Since the transfer layer is plated selectively, the resist can be removed in an oxygen plasma. This places fewer restrictions upon the resist and the planarizing layer.

As described earlier, the plated transfer layer process in accordance with the invention begins with the trilayer shown in FIG. 5A. Trilayer preparation is outlined in Table 1.

TABLE 1
Trilayer Preparation

1. Oxygen plasma clean
2. HMDS vapor prime
3. Planarizing layer application/bake
4. Plating base filament-evaporation
5. Oxygen plasma clean
6. SAL-601-ER7 application/bake PMGI, PMMA, or cured novolac resist can comprise the planarizing layer.

The plating base for the plated transfer layer consists of a thin layer of titanium on top of a thicker layer of gold. The thin titanium layer provides excellent resist adhesion, which is needed if transfer layer plating is to be achieved with tight linewidth control. The plating base is filament evaporated onto the planarizing layer to minimize exposure of the planarizing layer to radiation during the deposition. If e-beam evaporation is used to deposit the plating base, the planarizing layer is uniformly exposed during the deposition, and achieving straight sidewalls in the developed cross-section of the layer is difficult.

A negative e-beam resist, Shipley SAL-601-ER7, is coated and baked on top of the plating base. This Shipley resist provides high sensitivity and excellent contrast, contributing greatly to the linewidth control and throughput of the process. See, H. Liu, M. P. deGrandpre, W. E. Feely, "Characterization of a High-Resolution Novolak Based Negative Electron-Beam Resist with 4 $\mu$C/sq. cm Sensitivity," *J. Vac. Sci. Technol.* B 6(1),379,1988, and L. Blum, M. E. Perkins, "A Study of the Effect of Key Processing Variables on the Lithographic Performance of Microposit SAL-601-ER7 Resist," *J. Vac. Sci. Technol.* B, 1988.

E-beam exposure is performed at 10 to 20 μC/sq. cm, depending upon the required linewidth and the post-exposure bake temperature. The presence of the gold layer assures that no charging-induced distortion occurs in the written patterns, permitting exposure of insulating substrates.

The processing of the SAL-601-ER7 resist is outlined in Table 2.

TABLE 2
SAL-601-ER7 Processing

1. Post-exposure bake
2. SAL-601-ER7 development
3. Oxygen plasma descum

The SAL-601-ER7 resist requires a post-exposure bake which does not exceed 100° C. if the planarizing layer is PMMA. Above 100° C., PMMA begins to flow, distorting the plating base. If Shipley SAL-110 (PMGI) or AZ 1350 B (novolac) is used for the planarizing layer, the post-exposure bake can be performed at 110 C, providing greater resist contrast and sensitivity.

After development, the structure is as shown in FIG. 5B. FIG. 6 is a scanning electron microscope (SEM) photograph of a line of SAL-601-ER7 resist on top of the plating base.

The processing to produce the final lift-off structure is outlined in Table 3.

TABLE 3
Plated Transfer Layer Processing

1 Titanium etch
2. Nickel plating
 Sel-Rex Sulfamex plating solution per manufacturer's recommendations
3. Oxygen plasma resist removal
4. Plating base etch
5. Image transfer to planarizing layer The titanium can be dry-etched with $CBrF_3$ to avoid corrosion of the SAL-601-ER7 resist, as well as to avoid undercutting which could lead to a linewidth variation. If wet etching is used, the etch time is carefully controlled. Then, low-stress pure nickel is plated to form the transfer layer. Nickel has a very low dry-etch rate in chlorine- and fluorine-based plasmas, which contributes to linewidth control of the finished FET gate.

Following plating, the resist is stripped, and the plating base is etched away to expose the planarizing layer, which results in the structure shown in FIG. 5C. After the planarizing layer is patterned using either DUV exposure and development or oxygen reactive-ion etch (RIE), the structure appears as shown in FIG. 5D. FIGS. 7A, 7B, and 7C show SEM photographs of the resulting structure for PMGI, PMMA, and AZ 1350 B planarizing layers, respectively. Note that a residue is visible at the bottom of the opening in FIG. 7C. This residue is formed during dry-etching of the AZ 1350 B and is discussed below.

Linewidth control for the described plated transfer layer process is 0.25 micron +/−0.060 micron (2 sigma) based upon electrical measurements of 35 fabricated Ti-Pt-Au resistors on each of nine device wafers. The resistor test pattern used for measurement of linewidth variation contains resistors of 0.25 micron design width placed uniformly over the exposure field and sub-fields of the e-beam system. Measurements of resistance in seven areas of the sub-fields at the center and four corners of the exposure field were used to deduce linewidth and linewidth variation. This is possible since linewidth is proportional to 1/resistance.

Note that the test resistor fabrication process is identical to the FET gate process used for MODFETs. This ensures that the measured linewidth variation is the result that can be expected on actual device wafers.

FIG. 8 shows linewidth variation versus linewidth based upon these measurements. Note that the standard deviation of the linewidth measurements decreases as the linewidth decreases. Linewidths as small as 0.1 micron were fabricated with reduced yield. SEM measurements on over 50 device wafers have yielded similar linewidth control results, within the measurement accuracy of the SEM.

The largest source of linewidth variation is believed to be the post-exposure bake temperature. The post-exposure bake is currently performed in a vacuum oven. A cassette-to-cassette hot plate system is expected to improve temperature control of this step.

The largest source of linewidth variation on a single wafer is sub-field joining errors. However, FIG. 9 shows that the effect of joining errors is reduced with the plated transfer layer process, as compared to a process using positive resist. FIG. 9A shows the effect of a joining error for a positive resist process. A broken gate line is likely. FIG. 9B shows a similar joining error for the negative resist process in accordance with the invention. The linewidth variation is reduced, and the line is continuous.

As indicated earlier, a residue is formed during dry-etching of the AZ 1350 B planarizing layer. Auger analysis of this residue shows the presence of small amounts of nickel, indicating that redeposition of nickel sputtered from the plated transfer layer is the likely cause. However, cleaning out a small amount of residue with a short wet-etch is feasible. The advantage of a dry-etched planarizing layer is a tighter structure with less undercut.

This plated transfer layer process with the PMGI planarizing layer has been used to fabricate microwave MESFET integrated circuits with gate length (Lg) equal to 0.4 micron. 420 mW/mm output power and 6 dB gain at 18 GHz are typical for these devices. The gate process requires a reactive-ion etch (RIE) of about 2000 angstroms of oxide deposited on the GaAs substrate, and an ion-milling of the gate recess into the GaAs. After oxide RIE, the GaAs surface is rough, as shown in FIG. 10A. Auger analysis of the residue indicates that redeposition of sputtered nickel is the most likely cause.

Reducing the power used for the oxide RIE reduces, but does not eliminate, the residue. However, the surface appears smoother after a short dip in 1:1 buffered HF:DI water (FIG. 10B), and smoother yet after the ion-milling step (FIG. 10C). The final MESFET gate structure after Ti-Pt-Au deposition and lift-off is shown in FIG. 11.

This plated transfer layer process with the PMMA planarizing layer has been used to fabricate microwave MODFETs with Lg equal to 0.25 micron. 280 mW/mm output power and 6 dB gain at 40 GHz have been achieved. A PMMA planarizing layer is advantageous for MODFET fabrication, because it is solvent developed. An aqueous basic resist developer can etch the thin AlGaAs present on the substrate, and dry-etching the planarizing layer can induce damage in the substrate. FIG. 12 shows the final MODFET gate structure after Ti-Pt-Au deposition and lift-off in acetone.

A multilevel version of this plated transfer layer process using PMGI and PMMA can be used to fabricate gates with a "T" cross-section. FIG. 13 shows a typical resist structure before Ti-Pt-Au deposition. After deposition and lift-off, the cross-section shown in FIG. 14 is formed. The advantage of this structure is that the cross-sectional area of the metal line is increased, while the actual device gate length is maintained at 0.25 micron. This reduces the resistance of the gate line, improving device performance.

The process in accordance with the invention provides minimal sensitivity to exposure variations found in e-beam lithography, dose variation due to beam size variation, and sub-field stitching errors. The process has demonstrated good linewidth control and durability. While the overall process is complex, the individual process steps are relatively straightforward. Although a drawback of the process described above is redeposition of sputtered material from the plated transfer layer during oxide RIE, which causes roughness in an etched opening, a brief wet etch reduces the residue. Alternatively, a wet oxide etch can be substituted for the oxide RIE to avoid redeposition of the material used for the plated transfer layer. MESFET and MODFET performance has been demonstrated, and "T" gate structures are feasible.

Advantages of the process include the following. The process achieves good linewidth control with a 0.25 micron beam. 0.25+/−0.05 micron is routinely achieved based upon SEM photographs and electrical measurements. Only one evaporation step is required prior to gate metal deposition. A thin layer of evaporated gold eliminates charging during the e-beam writing and also serves as a plating base for the plated transfer layer.

The plated transfer layer consists of low-stress plated nickel, which has very low dry etch rates in chlorine- and fluorine-based plasmas. This provides good linewidth control throughout gate processing. The material used for the planarizing layer can be selected depending upon the semiconductor processing application. Accordingly, the planarizing layer can consist of PMGI, PMMA, or cured novolac resist.

Alternatively, DUV with a clear field mask can be used instead of e-beam exposure. In the case of DUV, the imaging layer preferably consists of PMMA instead of SAL-601-ER7 negative resist. The PMMA (6%) is spun onto the plating base at 500 rpm for five seconds. The rotation speed is then increased to 4000 rpm for 30 seconds. The PMMA is next cured on a hot plate at 170° C. for one hour. A clear field mask is then applied, and the PMMA is exposed through the clear field mask with 9000 mJ DUV at a wavelength of 220 nm. The exposed PMMA resist is then developed in 1:1 MIBK:ISO developer for one minute. Oxygen plasma is then used to descum. This is followed by the titanium dry-etch and following steps described above. One modification is to use acetone to remove the PMMA imaging layer after plating, rather than oxygen plasma removal used in the case of SAL-601-ER7 negative resist. This modified DUV process with a clear field mask has enabled 0.3 micron lines to be exposed in connection with fabrication of MESFETs.

The foregoing description is offered primarily for purposes of illustration. The multilevel resist plated transfer layer process in accordance with the invention has been used to fabricate discrete microwave MODFETs with 280 mW/mm output power and 6 dB gain at 40 GHz, and microwave integrated circuits with typical MESFET performance of 420 mW/mm output power and 6 dB gain at 18 GHz. Millimeter-wave FETs and integrated circuits have been fabricated. The process can also be used for gate length control for the follow-on to MMIC's, as well as other devices. While a variety of embodiments has been disclosed, it will be readily apparent to those skilled in the art that numerous other modifications and variations not mentioned above can still be made without departing from the spirit and scope of the invention as claimed below.

What is claimed is:

1. A multilevel resist process involving the use of a plated transfer layer useful for fabricating semiconductor devices on a substrate of semiconductor material, comprising the steps of:

applying a planarizing layer to the substrate of semiconductor material;

depositing a plating base onto the planarizing layer;

coating a negative e-beam resist onto the plating base to form an imaging layer;

exposing the negative e-beam resist with an electron beam;

developing the negative e-beam resist to produce a fine line of resist on top of the plating base;

plating a transfer layer onto the plating base except where the fine line of resist remains;

removing the fine line of resist to produce an opening in the plated transfer layer;

etching the plating base out of the opening in the plated transfer layer to reveal the planarizing layer; and processing the planarizing layer using the opening in the plated transfer layer.

2. The process of claim 1 wherein the planarizing layer consists of a material selected from among a group of materials comprising PMGI, PMMA, and novolac resist applied to the substrate of semiconductor material.

3. The process of claim 2 wherein the substrate of semiconductor material consists of GaAs.

4. The process of claim 1 wherein the step of depositing the plating base onto the planarizing layer comprises the step of evaporating a plating base of a thin layer of titanium on top of a thicker layer of gold onto the planarizing layer.

5. The process of claim 1 wherein the negative e-beam resist is Shipley SAL-601-ER7, further comprising the step of baking the negative e-beam resist on top of the plating base.

6. The process of claim 5 wherein the SAL-601-ER7 negative e-beam resist is exposed at 10 to 20 $\mu$C/sq. cm, further comprising the step of post-exposure baking the negative e-beam resist.

7. The process of claim 4 wherein the step of plating a transfer layer onto the plating base except where the fine line of resist remains comprises the steps of etching the titanium and selectively plating the plating material where the gold plating base is revealed.

8. The process of claim 7 wherein the step of etching the titanium comprises the step of dry etching the titanium.

9. The process of claim 1 wherein the plating material is nickel.

10. The process of claim 7 wherein the plating material is nickel.

11. The process of claim 5 wherein the step of removing the negative e-beam resist comprises the step of removing the SAL-601-ER7 negative e-beam resist in an oxygen plasma.

12. The process of claim 1 wherein the step of etching the plating base out of the opening in the plated transfer layer to reveal the planarizing layer comprises the step of wet etching the plating base out of the opening in the plated transfer layer to reveal the planarizing layer.

13. The process of claim 1 wherein the step of processing the planarizing layer using the opening in the plated transfer layer comprises the step of dry etching the planarizing layer.

14. The process of claim 1 wherein the step of processing the planarizing layer using the opening in the plated transfer layer comprises the steps of exposing and developing the planarizing layer using the plated transfer layer as a mask.

15. The process of claim 1, further comprising the steps of:
    etching a gate recess;
    depositing gate metal in the gate recess; and
    lifting the plated transfer layer and the planarizing layer.

16. The process of claim 15 wherein the step of etching the gate recess comprises the steps of reactive-ion etching about 2000 angstroms of oxide deposited on the substrate of semiconductor material and ion milling the gate recess into the substrate.

17. The process of claim 15 wherein the step of etching the gate recess comprises the step of wet oxide etching.

* * * * *